(12) United States Patent
Takeyama

(10) Patent No.: US 8,363,309 B2
(45) Date of Patent: Jan. 29, 2013

(54) OPTICAL AMPLIFIER AND METHOD FOR SUPPRESSING POLARIZATION DEPENDENT GAIN OF OPTICAL AMPLIFIER

(75) Inventor: Tomoaki Takeyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 332 days.

(21) Appl. No.: 12/814,686

(22) Filed: Jun. 14, 2010

(65) Prior Publication Data

US 2010/0315701 A1 Dec. 16, 2010

(30) Foreign Application Priority Data

Jun. 15, 2009 (JP) .................................. 2009-142331

(51) Int. Cl.
*H04B 10/17* (2006.01)
*H01S 3/067* (2006.01)
(52) U.S. Cl. .................................................... 359/341.3
(58) Field of Classification Search ... 359/341.3–341.33
See application file for complete search history.

(56) References Cited

U.S. PATENT DOCUMENTS

| | | | |
|---|---|---|---|
| 6,501,594 B1* | 12/2002 | Hwang et al. | 359/341.32 |
| 6,603,594 B2* | 8/2003 | Islam | 359/334 |
| 6,934,078 B2* | 8/2005 | Hwang et al. | 359/341.32 |
| 7,068,425 B2* | 6/2006 | Hwang et al. | 359/349 |
| 7,106,970 B2 | 9/2006 | Fujiwara et al. | |
| 7,391,562 B2* | 6/2008 | Kinoshita | 359/341.32 |
| 2002/0181090 A1* | 12/2002 | Song et al. | 359/349 |
| 2002/0181091 A1* | 12/2002 | Song et al. | 359/349 |
| 2003/0161033 A1* | 8/2003 | Hwang et al. | 359/341.3 |
| 2003/0169490 A1* | 9/2003 | Hwang et al. | 359/341.41 |
| 2003/0179442 A1* | 9/2003 | Hwang | 359/341.41 |
| 2004/0109226 A1* | 6/2004 | Song et al. | 359/341.1 |
| 2004/0212873 A1* | 10/2004 | Hwang et al. | 359/333 |
| 2004/0233518 A1* | 11/2004 | Song et al. | 359/349 |
| 2005/0105169 A1* | 5/2005 | Hwang et al. | 359/341.1 |
| 2005/0185261 A1* | 8/2005 | Hwang et al. | 359/341.1 |
| 2010/0315702 A1* | 12/2010 | Itoh et al. | 359/341.33 |

FOREIGN PATENT DOCUMENTS

JP 2003-315739 11/2003

OTHER PUBLICATIONS

"Spectral Dependence of Polarization Hole-Burning", C. R. Davidson et al., Optical Fiber Communication Conference, 2006 and the 2006 National Fiber Optic Engineers Conference, OFC 2006.
"Measurement of polarisation-dependent gain in EDFAs against input degree of polarisation and gain compression", F. Bruyere, pp. 401-403, Electronics Letters, Mar. 2, 1995, vol. 31, No. 5.
"Erbium doped optical fiber amplifier" Shoichi Sudo, Optronics Co., Ltd., pp. 59-61.

\* cited by examiner

*Primary Examiner* — Isam Alsomiri
*Assistant Examiner* — Ari M Diacou
(74) *Attorney, Agent, or Firm* — Staas & Halsey LLP

(57) ABSTRACT

An apparatus includes a first optical amplifier that uses a rare-earth-doped optical medium, an isolator that inputs amplified light amplified by the first optical amplifier, a second optical amplifier that uses a rare-earth-doped optical medium to amplify a light output from the isolator, and a first light router that routes amplified spontaneous emission light generated by the first optical amplifier or the second optical amplifier to input, by a second light router, the routed amplified spontaneous emission light to the optical rare-earth-doped medium other than the optical rare-earth-doped medium where the routed amplified spontaneous emission light is generated.

16 Claims, 8 Drawing Sheets

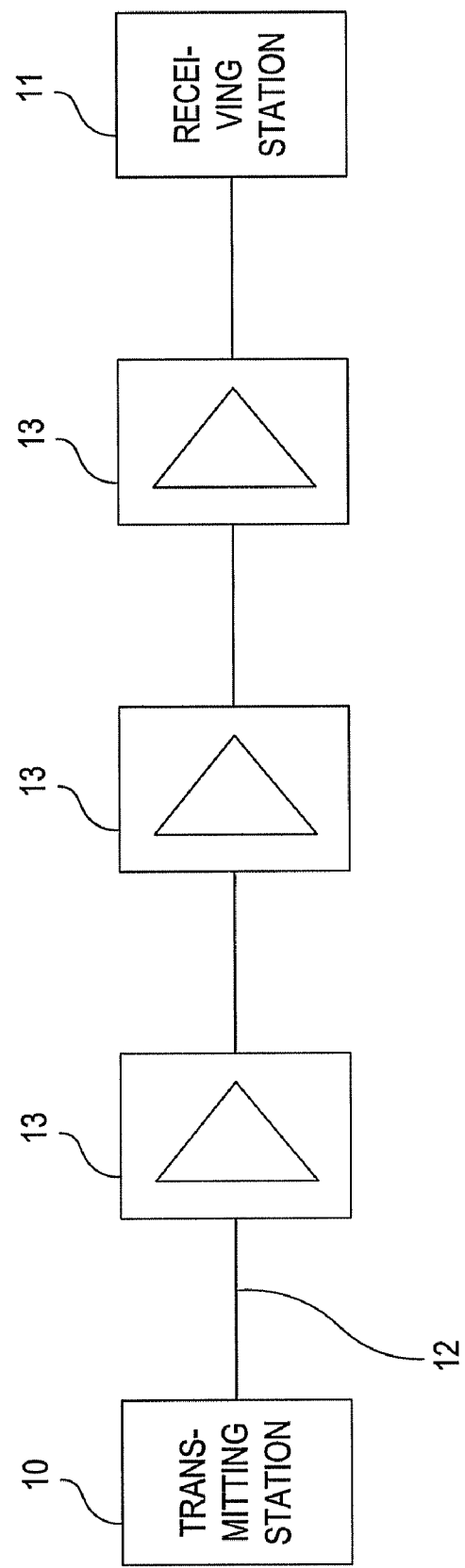

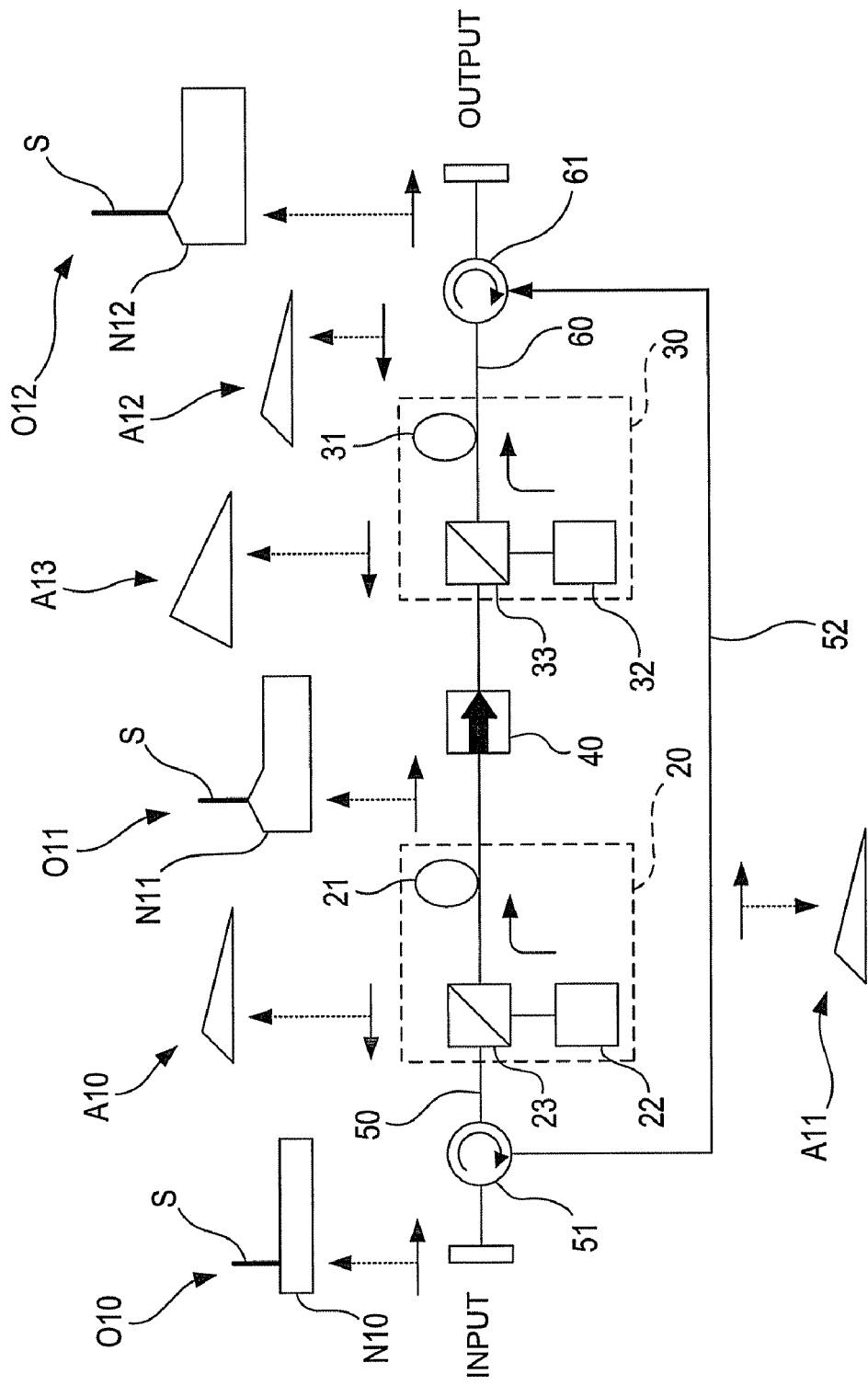

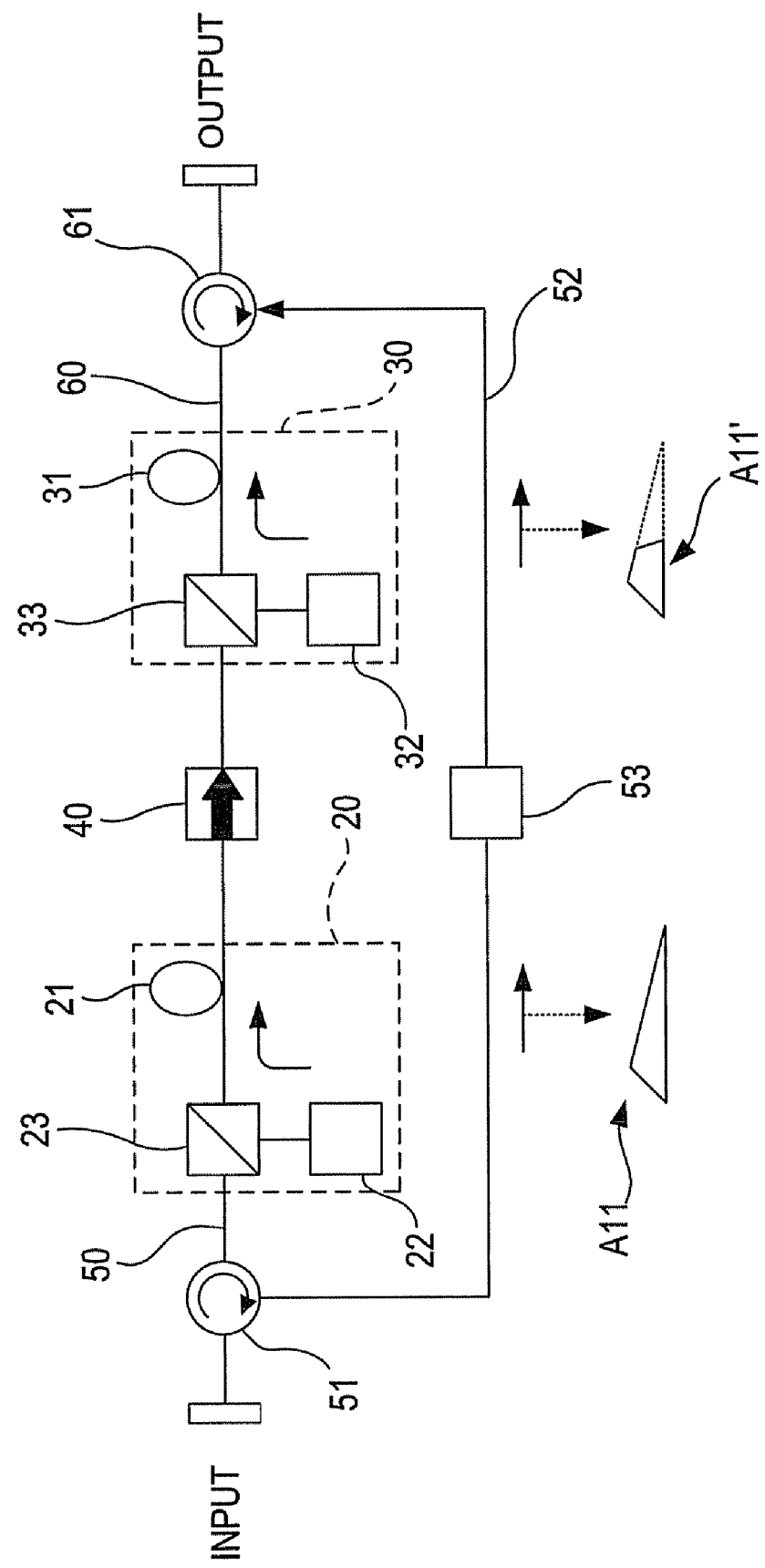

OPTICAL AMPLIFIER AND METHOD FOR SUPPRESSING POLARIZATION DEPENDENT GAIN OF OPTICAL AMPLIFIER

CROSS REFERENCE TO RELATED APPLICATION

This application is based upon and claims the benefit of priority of the prior Japanese Patent Application No. 2009-142331, filed on Jun. 15, 2009, the entire contents of which are incorporated herein by reference.

FIELD

Technologies described herein relate to optical amplifiers using rare-earth-doped optical mediums.

BACKGROUND

Relay stations in optical transmission systems included in optical communication networks have adopted optical amplifiers that amplify optical signals as they are instead of using regenerative relaying involving photoelectric conversion so as to support faster (wider-bandwidth) optical signals. Optical amplifiers commonly used nowadays include those using rare-earth-doped optical fibers as amplifying mediums. In particular, erbium-doped fiber amplifiers (EDFAs) using erbium-doped fibers (EDFs) as amplifying mediums have mainly been used.

Since recent networks require a longer relay distance, higher gains are required for optical amplifiers of relay stations. When EDFAs are used, excellent amplification can be achieved by using serially connected (cascaded) EDFAs with two stages rather than EDFAs with single stages with consideration of noise figure (NF). FIG. 7 illustrates an optical amplifier including an EDFA 1 serving as a first optical amplifier and an EDFA 2 serving as a second optical amplifier serially connected to each other with an optical isolator 3 for preventing loop oscillation interposed therebetween.

The first EDFA 1 is of the forward pumping type, and includes a first EDF 1a, a first excitation light source 1b that generates excitation light, and a first optical multiplexer 1c that is disposed upstream of the first EDF 1a and multiplexes input light and excitation light generated by the first excitation light source 1b so as to supply the resultant light to the first EDF 1a. Moreover, a second EDFA 2 is of the same forward pumping type, and includes a second EDF 2a, a second excitation light source 2b that generates excitation light, and a second optical multiplexer 2c that is disposed upstream of the second EDF 2a and multiplexes input light and excitation light generated by the second excitation light source 2b so as to supply the resultant light to the second EDF 2a.

In the optical amplifier illustrated in FIG. 7, signal light is input to the first EDF 1 through the first optical multiplexer 1c first. Excitation light is also supplied from the first excitation light source 1b to the first EDF 1a via the first optical multiplexer 1c, and the signal light input to the first EDF 1a is amplified by stimulated emission from erbium excited by the excitation light. The signal light amplified by and output from the first EDFA 1 is input to the second EDF 2a, to which excitation light is supplied from the excitation light source 2b, through an optical isolator 3 and the second optical multiplexer 2c, and is amplified in a manner similar to that in the first EDF 1a. The optical isolator 3 transmits light in only one direction from the first EDFA 1 to the second EDFA 2. With this, the isolator prevents a resonator structure from being formed, the structure having connecting points of an optical path using, for example, optical connectors serving as reflective ends at an input port IN and an output port OUT of the optical amplifier, and prevents loop oscillation of the optical amplifier.

When optical signals are amplified and relayed using the optical amplifier illustrated in FIG. 7, polarization dependent gain (PDG) occurs due to polarization hole burning (PHB) that arises in the EDFs 1a and 2a of the first and second EDFAs 1 and 2, respectively. The effect of polarization dependent gain may accumulate and may have an adverse effect when a system includes a plurality of relay stations using the optical amplifier illustrated in FIG. 7 on transmission paths thereof. For example, when signal light in the C band (approximately from 1,528 nm to 1,565 nm) is amplified and relayed, the optical signal-to-noise ratio (OSNR) of signal components in a short wavelength region in the C band is often measurably reduced.

Polarization hole burning is a phenomenon that causes the gain of signal light input to EDFs to vary in accordance with the polarization state of excitation light and the signal light input to the EDFs (Shoichi Sudo, Erbium-doped optical fiber amplifier; Optronics Co., Ltd.: Tokyo, 1999; pp 59-61). When signal light with a high intensity and a high degree of polarization (DOP) is input to EDFs, gain of light components in a polarization direction parallel to the polarization direction of the signal light is reduced due to polarization hole burning. Variations in gain in the EDFs also affect amplified spontaneous emission (ASE) light arising inside the EDFs in addition to the signal light. ASE light is not polarized, and includes polarized components parallel to the polarization direction of the signal light and those perpendiculars to the polarization direction. Therefore, only the polarized components parallel to the signal light among those in the ASE light are affected by variations in gain caused by the polarization hole burning. That is, the polarization hole burning causes a reduction in gain of the signal light and a reduction in gain of the polarized components parallel to the signal light among those in the ASE light while the gain of the polarized components perpendicular to the signal light is not reduced. Therefore, a difference between the gain of polarized components parallel to the signal light with a high degree of polarization and the gain of polarized components perpendicular to the signal light among those in the ASE light arising in the EDFs serves as a polarization dependent gain. This reduces the OSNR of the output light after being amplified compared with the case without polarization hole burning as a result of a relative increase in the proportion of the polarized components perpendicular to the signal light among those in the ASE light. That is, when signal light in a short wavelength region in the C band has a high intensity and a high degree of polarization, the light is affected by the polarization dependent gain caused by the polarization hole burning, and the OSNR thereof after amplification is reduced.

Herein, the polarization dependent gain caused by the polarization hole burning depends on the degree of polarization of the light in the EDFs, and is suppressed as the degree of polarization is reduced (For example, see Bruere F. Measurement of polarization-dependent gain in EDFAs against input degree of polarization and gain compression; Electron. Lett. 1995, 31, No. 5, pp 401-403). The term "degree of polarization" refers to a ratio of the light power of completely polarized components to total light power at a specific wavelength. When the degree of polarization is zero, it refers to a non-polarized state, and when it is one, it refers to a completely polarized state.

In FIG. 7, input light O1 including signal light S in a short wavelength region in the C band and noise light N1 with wavelengths over the entire C band may be input to the first EDFA 1. In this case, the input light O1 before being amplified has an OSNR depending on the power of the signal component with the wavelength of the signal light and the power of the noise component.

When the degree of polarization of the signal light S included in the input light O1 is high, the signal light is affected by the polarization dependent gain caused by the above-described polarization hole burning in the first EDFA 1. As a result, output light O2 after amplification by the first EDFA 1 has a higher proportion of a noise component N2 with wavelengths, in particular, adjacent to that of the signal light S, and the OSNR of the signal light S is reduced.

The output light O2 after amplification by the first EDFA 1 is subsequently input to the second EDFA 2, and further amplified by the second EDFA 2. The input light O2 is also affected by the polarization dependent gain caused by the polarization hole burning in the second EDFA 2. Therefore, output light O3 after amplification by the second EDFA 2 has a still higher proportion of a noise component N3 with wavelengths adjacent to that of the signal light S, and the OSNR of the signal light S is further reduced.

Although an optical amplifier of the forward pumping type is illustrated in FIG. 7, the OSNR may be similarly reduced even with an optical amplifier of the bidirectional pumping type.

For example, Japanese Unexamined Patent Application Publication No. 2003-315739 describes a technology for passing transmission light through a polarization scrambler in a transmitting station and sending the transmission light to a transmission path so that the transmission light is made non-polarized in order to reduce the degree of polarization of the input light to zero with consideration of polarization dependent gain in EDFAs.

When a polarization scrambler is used, the polarization scrambler needs to be controlled in synchronization with, for example, an optical modulator that generates signal light as described in Japanese Unexamined Patent Application Publication No. 2003-315739. However, the control of the polarization scrambler becomes difficult as the speed of signal light is increased, and presents problems for practical application. In addition, this leads to an increase in costs.

In view of the above-described background, apparatuses and methods for suppressing polarization dependent gain without using polarization scramblers are required.

Herein, a structure for suppressing polarization dependent gain of an optical amplifier, including a first optical amplifier and a second optical amplifier serially connected to each other on an optical path between an input port and an output port with an optical isolator interposed therebetween, will be described.

SUMMARY

According to an aspect of the invention, an apparatus includes a first optical amplifier that uses a rare-earth-doped optical medium; an isolator that inputs amplified light amplified by the first optical amplifier; a second optical amplifier that uses a rare-earth-doped optical medium to amplify a light output from the isolator; and a first light router that routes amplified spontaneous emission light generated by the first optical amplifier or the second optical amplifier to input, by a second light router, the routed amplified spontaneous emission light to the optical rare-earth-doped medium other than the optical rare-earth-doped medium where the routed amplified spontaneous emission light is generated.

The object and advantages of the various embodiments will be realized and attained by means of the elements and combinations particularly pointed out in the claims.

It is to be understood that both the foregoing general description and the following detailed description are exemplary and explanatory and are not restrictive of the various embodiments, as claimed.

BRIEF DESCRIPTION OF THE DRAWINGS

FIG. 1 illustrates an example optical transmission system.
FIGS. 2A and 2B illustrate optical amplifiers according to a first embodiment.

DESCRIPTION OF EMBODIMENTS

Figure 3:
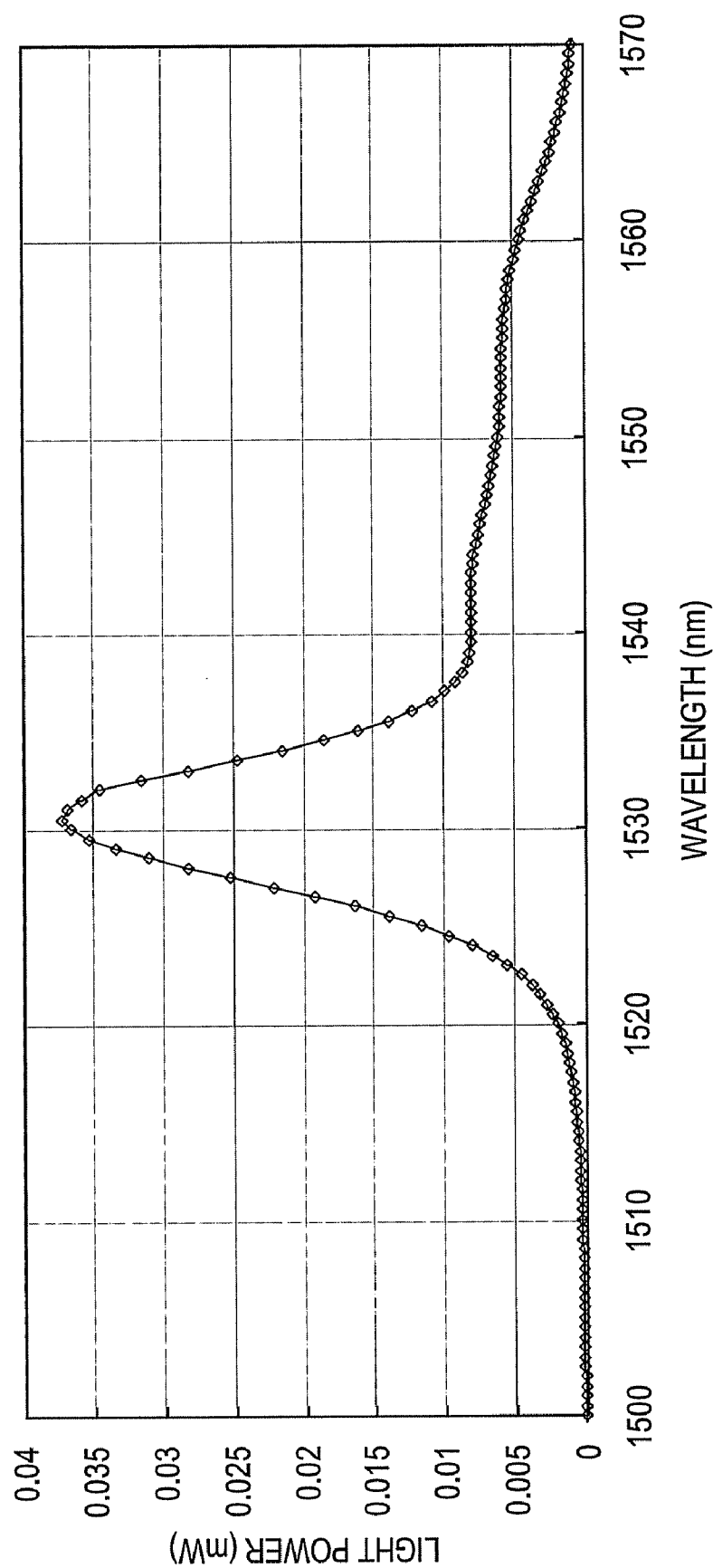
FIG. 3 illustrates a spectral shape of amplified spontaneous emission light that arises in an erbium-doped fiber (EDF).

FIG. 1 illustrates an example optical transmission system including relay stations with optical amplifiers.

A transmitting station 10 and a receiving station 11 are connected by an optical-fiber transmission path 12, and a large number of relay stations 13 are disposed on the optical-fiber transmission path 12. Each relay station 13 includes an optical amplifier, and optical signals transmitted through the optical-fiber transmission path 12 are amplified and relayed. Optical signals transmitted between the transmitting station 10 and the receiving station 11 can include wavelength-division-multiplexed (WDM) signal light or single-wavelength signal light.

FIG. 2A illustrates an example optical amplifier according to a first embodiment included in the relay stations 13.

The optical amplifier illustrated in FIG. 2A includes a first amplifier 20 and a second amplifier 30 that are serially connected to each other (cascaded), and an optical isolator 40 disposed between the first amplifier 20 and the second amplifier 30. Although an optical amplifier including two cascaded amplifiers is described as an example herein, the optical amplifier can include three or more cascaded amplifiers.

The first amplifier 20 of the forward pumping type according to an embodiment includes a first EDF 21 serving as a first rare-earth-doped optical fiber, a first excitation light source 22 that generates excitation light for pumping erbium added to the first EDF 21 as a rare earth element, and a first optical multiplexer 23 that is disposed upstream of the first EDF 21 and supplies the excitation light from the first excitation light source 22 to the first EDF 21. When WDM signal light is amplified, the amplifier can include a gain equalizer that approximates the wavelength-gain characteristic to a flat shape. The first excitation light source 22 includes, for example, a laser diode that generates excitation light with a wavelength of, for example, 0.98 μm or 1.48 μm. The first optical multiplexer 23 includes, for example, a WDM coupler.

The second amplifier 30 of the forward pumping type according to an embodiment includes a second EDF 31 serving as a second rare-earth-doped optical fiber, a second excitation light source 32 that generates excitation light for pumping erbium added to the second EDF 31, and a second optical multiplexer 33 that is disposed upstream of the second EDF 31 and supplies the excitation light from the second excitation light source 32 to the second EDF 31. Furthermore, the amplifier can include a gain equalizer. As in the first amplifier 20, the second excitation light source 32 includes, for example, a laser diode that generates excitation light with a wavelength of, for example, 0.98 μm or 1.48 μm, and the second optical multiplexer 33 includes, for example, a WDM coupler.

The first excitation light source 22 and the second excitation light source 32 can be a single light source, and can supply excitation light to the EDFs 21 and 31. Herein, the amplifiers 20 and 30 are also referred to as first and second erbium-doped fiber amplifiers (EDFAs), respectively.

The optical isolator 40 interposed between the EDFAs 20 and 30 has a characteristic of subjecting light traveling forward from the first EDFA 20 to the second EDFA 30 to low loss and subjecting light traveling backward from the second EDFA 30 to the first EDFA 20 to high loss, that is, serves as an optical device that allows passage of light only in one direction. The optical isolator 40 prevents a resonator structure from being formed, the substrate having connecting points of an optical path using, for example, optical connectors serving as reflective ends at an input port IN and an output port OUT of the optical amplifiers 20 and 30, and prevents loop oscillation of the optical amplifier.

A light supplying unit (or light router) 51 is disposed on an optical path 50 that transmits input light to the first EDF 21 of the first EDFA 20. A light router 51 has an input port and at least two output ports and may change a first light path into a second light path different from the first light path. The light supplying unit 51 includes, for example, an optical circulator. While the input light traveling forward to the first EDF 21 is transmitted as it is through the optical path 50, amplified spontaneous emission (ASE) light arising in the first EDF 21 and traveling in a direction opposite to the traveling direction of the input light is supplied from the optical path 50 to an ASE-light transmission path (for example, an optical fiber) 52. The light supplying unit 51 using an optical circulator can, for example, transmit the input light from a first port to a second port, and can transmit the ASE light from the EDF 21 from the second port to a third port. Although the light supplying unit 51 can be disposed on an optical path between the first optical multiplexer 23 and the first EDF 21, excitation efficiency may be reduced due to the loss of the excitation light at the connecting points of the light supplying unit 51 (loss from, for example, connecting state of connectors). Accordingly, the supplying unit can be disposed upstream of the first optical multiplexer 23 as illustrated in FIG. 2A.

A light input unit (light router) 61 is disposed on an optical path 60 that transmits output light from the second EDF 31 of the second EDFA 30. The light input unit 61 includes, for example, an optical circulator. The output light output from the second EDF 31 and traveling forward on the optical path 60 is transmitted as it is through the light input unit 61. On the other hand, ASE light supplied by the light supplying unit 51 and transmitted through the ASE-light transmission path 52 is input to the second EDF 31 from downstream of the second EDF 31 through the light input unit 61. The light input unit 61 using an optical circulator can, for example, transmit the output light from a first port to a second port, and can transmit the ASE light from the ASE-light transmission path 52 from a third port to the first port.

The light supplying unit 51 and the light input unit 61 are not limited to the optical circulators, and can be a combination of, for example, an optical coupler and an optical isolator. However, an optical circulator may be more preferable since an optical coupler causes an insertion loss of about 3 dB, which is more than that of the optical circulator.

The ASE light arising in the EDFs 21 and 31 and traveling backward has a spectral shape illustrated in FIG. 3. In FIG. 3, the abscissa represents the wavelength (nm), and the ordinate represents the light power (mW). The spectrum of the ASE light arising in the EDFs 21 and 31 and traveling backward extends in a certain range and has a peak at about 1,530 nm. That is, the ASE light arising in the EDFs 21 and 31 and traveling backward has a spectral band including the C band approximately from 1,528 nm to 1,565 nm.

It is conceivable that the ASE light traveling backward arises in the EDFs 21 and 31 as follows.

First, the forward-pumping excitation light is input to the EDF from an input end thereof. With this, the population inversion factor (excitation state) of erbium in the vicinity of the input end is increased in the EDF. When the population inversion factor is increased in the EDF, a large amount of ASE light arises in a short wavelength region in the C band. The ASE light travelling in a direction toward the input end of the EDF among the generated ASE light is emitted from the input end of the EDF while being amplified inside the EDF. The emitted ASE light travels on the optical path 50 in the direction opposite to that of the input light. The ASE light exhibits a spectral shape having a maximum peak power in a short wavelength region in the C band.

In FIG. 2A, the ASE light arising in the first EDF 21 and traveling backward is transmitted from the optical path 50 to the ASE-light transmission path 52 by the light supplying unit 51. The ASE light output to the ASE-light transmission path 52 is transmitted to the light input unit 61 through the ASE-light transmission path 52, and sent from the light input unit 61 to the second EDF 31. The ASE light input to the second EDF 31 from the downstream thereof by the light input unit 61 travels in the direction opposite to that of the input light and is amplified inside the second EDF 31.

The ASE light input from the light input unit 61 and traveling backward inside the second EDF 31 is non-polarized light including a large amount of short wavelength components in the C band as illustrated in FIG. 3. Therefore, the ASE light reduces the degree of polarization (DOP) of the input light including the signal light in a short wavelength region in the C band traveling forward in the second EDF 31. That is, when non-polarized light with wavelengths in the vicinity of that of the signal light is input to the rare-earth-doped optical fiber through which the signal light with a high degree of polarization is transmitted, the degree of polarization of the signal light is reduced. For example, when non-polarized light with wavelengths in a range of ±2.5 nm of the wavelength of signal light with a high degree of polarization is input to an EDF, the degree of polarization of the signal light is reduced. As a result of a reduction in the degree of polarization of the input light to be amplified traveling forward in the second EDF 31, polarization dependent gain (PDG) caused by polarization hole burning (PHB) is suppressed.

FIG. 2A schematically illustrates spectral distributions O10, A10, O11, A13, A12, and O12 of the input light and the ASE light at principal parts in the optical amplifier according to the first embodiment.

In the optical amplifier illustrated in FIG. 2A, input light O10 including signal light S in a short wavelength region in the C band and noise light N10 over the entire C band is input to the first EDFA 20. In this case, the input light O10 before being amplified has an OSNR depending on the power of the signal component at the signal light wavelength and the power of the noise component.

When the degree of polarization of the signal light S included in the input light O10 is high, the signal light is affected by the polarization dependent gain caused by the polarization hole burning in the first EDFA 20. As a result, output light O11 after amplification by the first EDFA 20 has a higher proportion of a noise component N11 with wavelengths, in particular, adjacent to that of the signal light S, and the OSNR of the signal light S is reduced.

During amplification by the first EDFA 20, ASE light A10 that travels in a direction opposite to that of the input light O10 arises. The ASE light A10 arising in the first EDFA 20 and traveling backward on the optical path 50 is supplied to the ASE-light transmission path 52 by the light supplying unit 51. The supplied ASE light A11 is transmitted to the light input unit 61 through the ASE-light transmission path 52.

Subsequently, the output light O11 after amplification by the first EDFA 20 is input to the second EDFA 30, and is further amplified by the second EDFA 30. At this moment, ASE light A12 traveling backward is input from the light input unit 61 to the second EDFA 30. The ASE light A12 is the ASE light A11 transmitted to the light input unit 61 through the ASE-light transmission path 52, and is in a non-polarized state with a spectral shape having a peak in a short wavelength region in the C band as illustrated in FIG. 3. Therefore, the degree of polarization of the input light O11 amplified in the second EDF 31 is reduced in the vicinity of the wavelength of the signal light S, and the polarization dependent gain caused by the polarization hole burning is suppressed. As a result, the noise component N12 in the vicinity of the wavelength of the signal light S in the output light O12 output from the second EDFA 30 is prevented from being increased, and the OSNR of the signal light S is improved.

Figure 4:
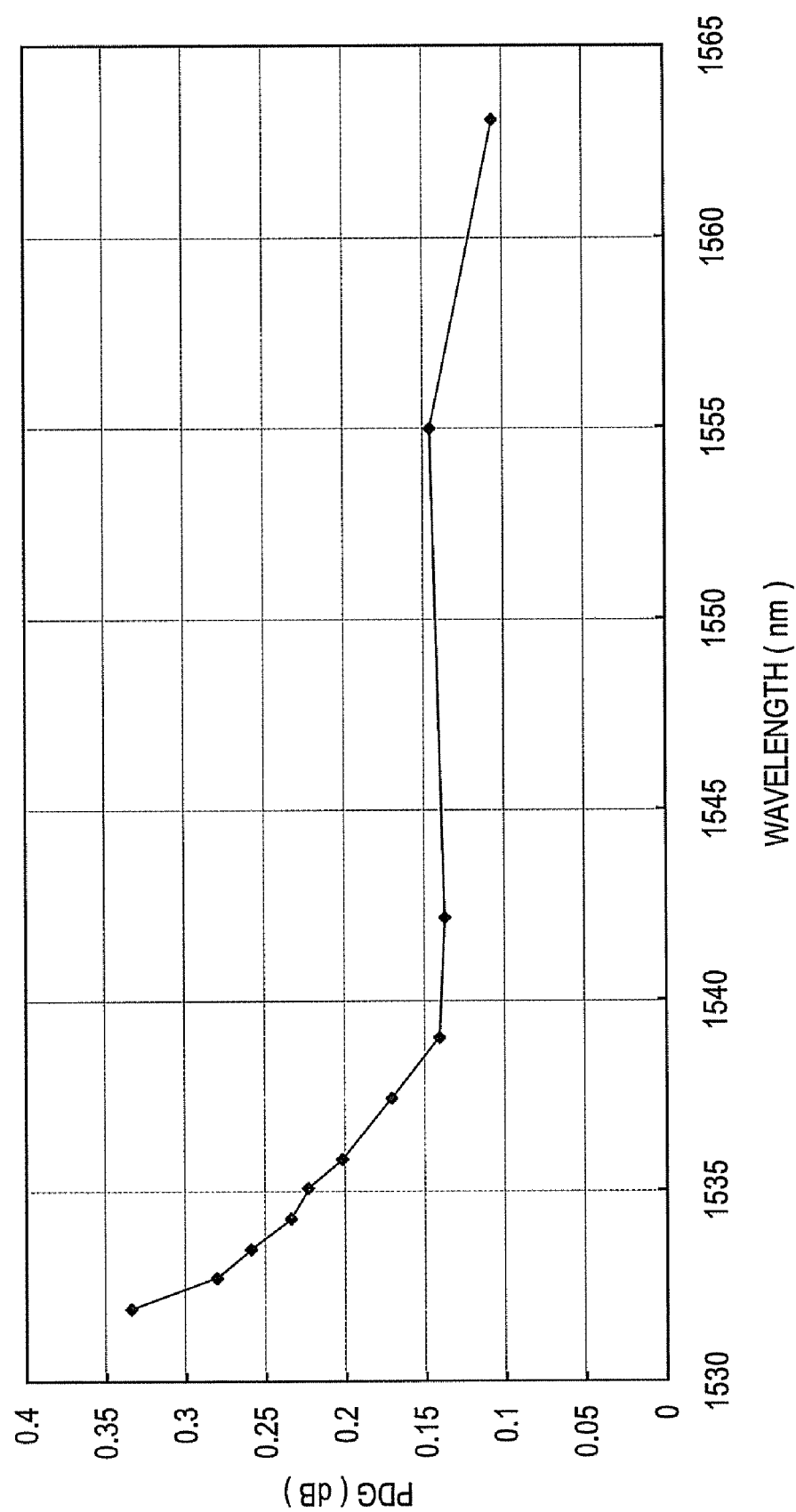
FIG. 4 illustrates polarization dependent gain (PDG) of an EDF to an optical signal in the C band.

As illustrated in FIG. 4, the polarization dependent gain occurring in the EDF on the signal light in the C band prominently appears in, in particular, light component with wavelengths shorter than 1,540 nm (Davidson C. R., et al. "Spectral Dependence of Polarization Hole-Burning" Optical Fiber Communication Conference and Exposition and The National Fiber Optic Engineers Conference, Technical Digest. CD-ROM. Optical Society of America: Washington, D.C., 2006; paper OThC3). In FIG. 4, the abscissa represents the wavelength (nm), and the ordinate represents the polarization dependent gain (dB).

However, deviation of the polarization dependent gain during amplification of the input light O11 in the second EDF 31 is suppressed since the ASE light A12 having a peak at a wavelength adjacent to 1,530 nm as illustrated in FIG. 3 is input to the second EDF 31 and the degree of polarization is reduced in the vicinity of 1,530 nm.

The ASE light A12 input to the second EDFA 30 from downstream thereof travels backward, is amplified in the second EDF 31, and is output from upstream of the second EDFA 30. However, the ASE light A13 output from the second EDFA 30 is blocked by the optical isolator 40.

FIG. 2B illustrates an optical amplifier similar to that according to the first embodiment illustrated in FIG. 2A except that the optical amplifier includes a band pass filter 53 that allows passage of the ASE light on the ASE-light transmission path 52.

The band pass filter 53 allows passage of the ASE light A11 with wavelengths in a required band among the ASE light A11 supplied by the light supplying unit 51. That is, the band pass filter 53 allows passage of light only in a band in the vicinity of the wavelength of the signal light S of the input light O11 illustrated in FIG. 2A within the band of the ASE light A11. ASE light A11' is generated by blocking the other unnecessary bands. The band-limited ASE light A11' is input to the second EDFA 30 from downstream thereof through the light input unit 61.

As illustrated in FIG. 4, when the polarization dependent gain caused by the polarization hole burning prominently appears in a part of wavelengths, the polarization dependent gain during amplification of the input light O11 in the second EDF 31 can be suppressed by providing the band-limited ASE light A11', whose band is limited by the band pass filter 53 in accordance with the wavelength at which the polarization dependent gain prominently appears, to the second EDFA 30. Furthermore, energy of the excitation light consumed by the amplification of the ASE light A11' in the second EDF 31 can be reduced.

Figure 5:
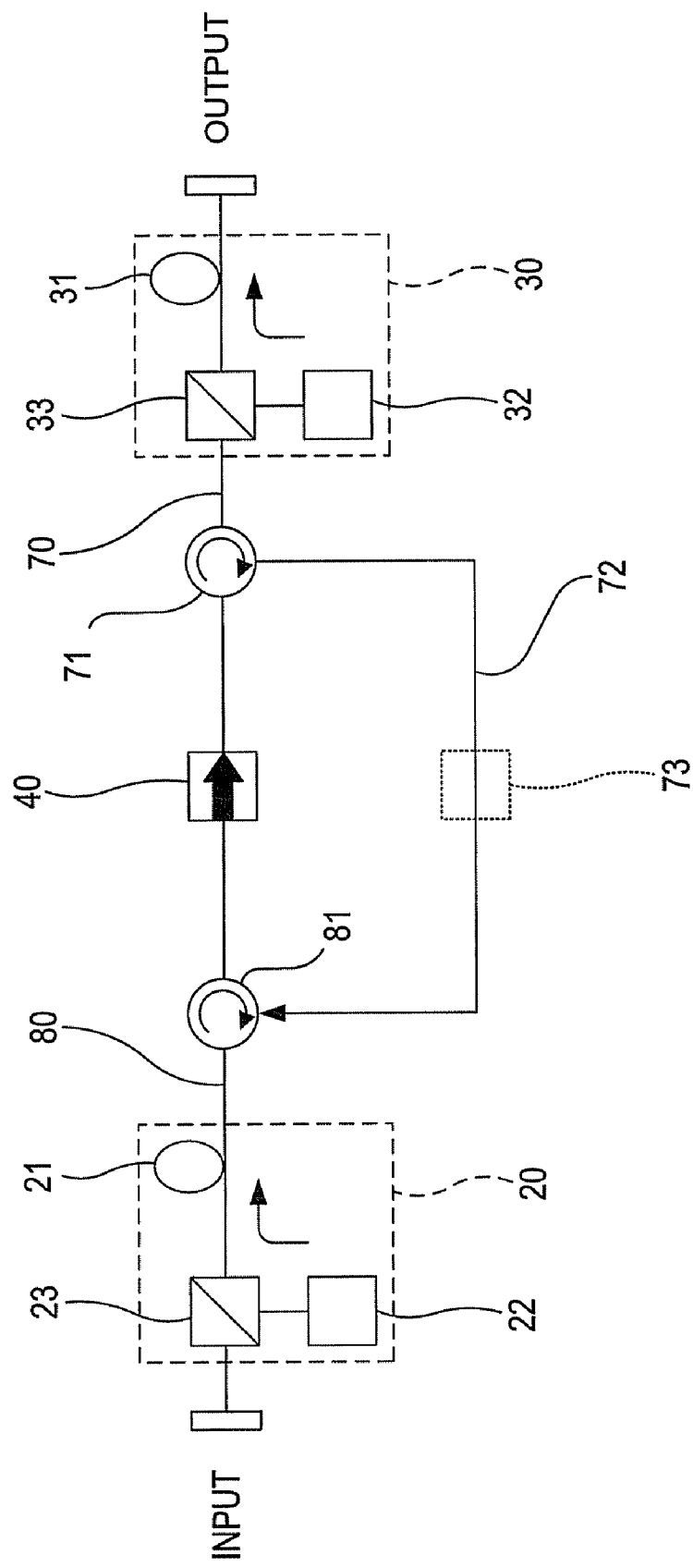
FIG. 5 illustrates an optical amplifier according to a second embodiment.

FIG. 5 illustrates an optical amplifier according to a second embodiment. The optical amplifier according to the second embodiment inputs ASE light arising in the second EDFA 30 and traveling backward to the first EDF 21 from downstream of the first EDFA 20. The first EDFA 20, the second EDFA 30, and the optical isolator 40 are the same as those in the first embodiment.

The optical amplifier illustrated in FIG. 5 includes an optical path 70 that transmits input light to the second EDF 31 and a light supplying unit (light router) 71 disposed on the path. The light supplying unit 71 supplies the ASE light arising in the second EDF 31 and traveling in a direction opposite to that of the input light from the optical path 70 to an ASE-light transmission path 72. The light supplying unit 71 includes, for example, an optical circulator. While the input light traveling to the second EDF 31 is transmitted as it is through the optical path 70, the ASE light traveling backward from the second EDF 31 is extracted from the optical path 70 to the ASE-light transmission path 72. That is, the light supplying unit 71 using an optical circulator can, for example, transmit the input light from a first port to a second port, and can transmit the ASE light from the second port to a third port.

Moreover, the optical amplifier illustrated in FIG. 5 includes an optical path 80 that transmits output light from the first EDF 21 and a light input unit (light router) 81 on the path. The light input unit 81 inputs the ASE light supplied by the light supplying unit 71 and transmitted through the ASE-light transmission path 72 to the first EDF 21 from downstream of the first EDFA 20. The light input unit 81 includes, for example, an optical circulator. The light input unit 81 using an optical circulator can, for example, transmit the output light from a first port to a second port, and can transmit the ASE light from a third port to the first port.

The first excitation light source 22 and the second excitation light source 32 can be a single light source, and can split and supply excitation light to the EDFs 21 and 31.

In the optical amplifier according to the second embodiment, the ASE light arising in the second EDF 31 and traveling backward has a spectral shape illustrated in FIG. 3. Therefore, the degree of polarization of components of the input light amplified in the first EDF 21, the components having wavelengths adjacent to that of the signal light S in a short wavelength region in the C band, is reduced by the ASE light extracted by the light supplying unit 71 and input from the light input unit 81 to the first EDFA 20. As in the first embodiment, the OSNR of the light output from the optical amplifier according to the second embodiment after amplification is improved since the polarization dependent gain caused by the polarization hole burning in the first EDF 21 is suppressed due to a reduction in the degree of polarization of the input light.

As illustrated by dotted lines in FIG. 5, the optical amplifier according to the second embodiment can also include a band pass filter 73 on the ASE-light transmission path 72 so as to allow passage of the ASE light in a desired band.

Figure 6:
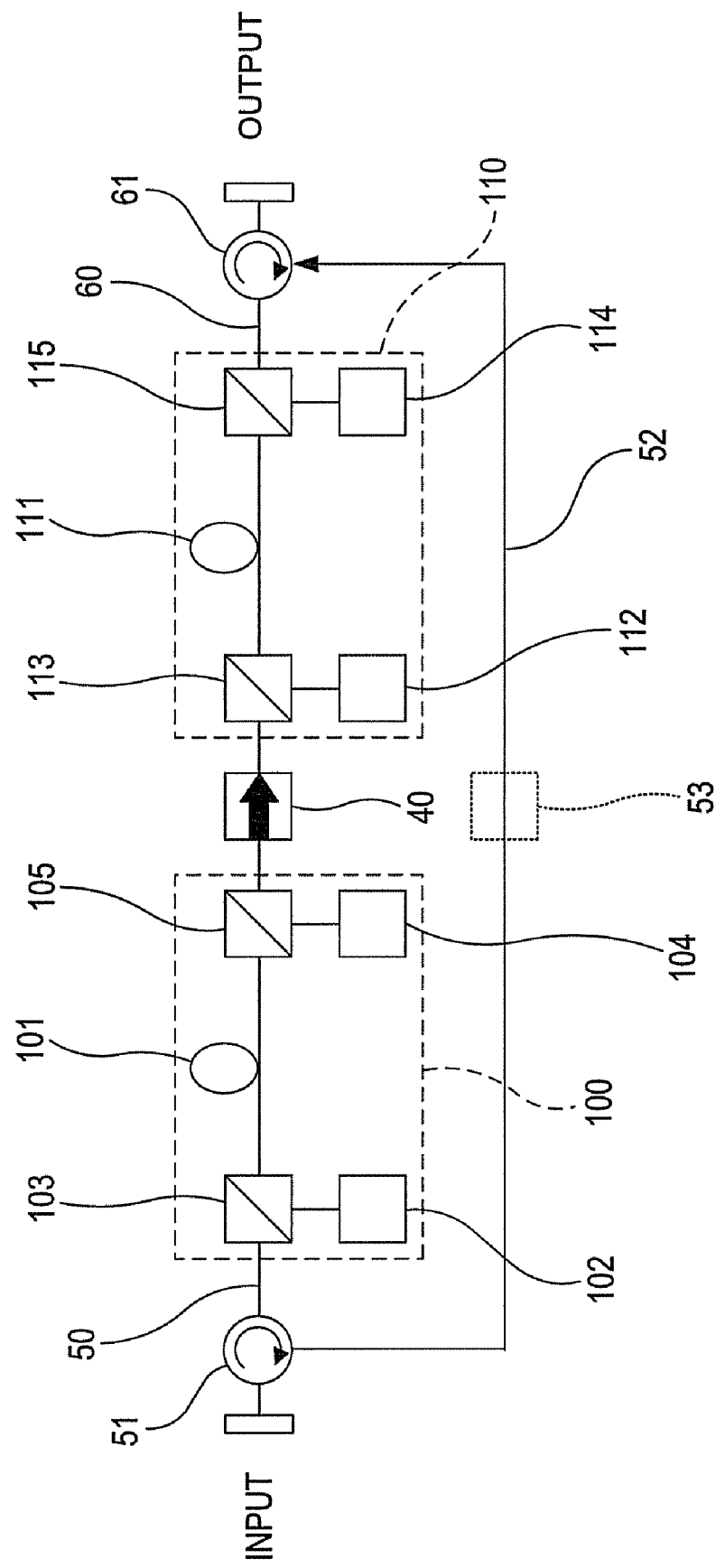
FIG. 6 illustrates an optical amplifier according to a third embodiment.
Figure 7:
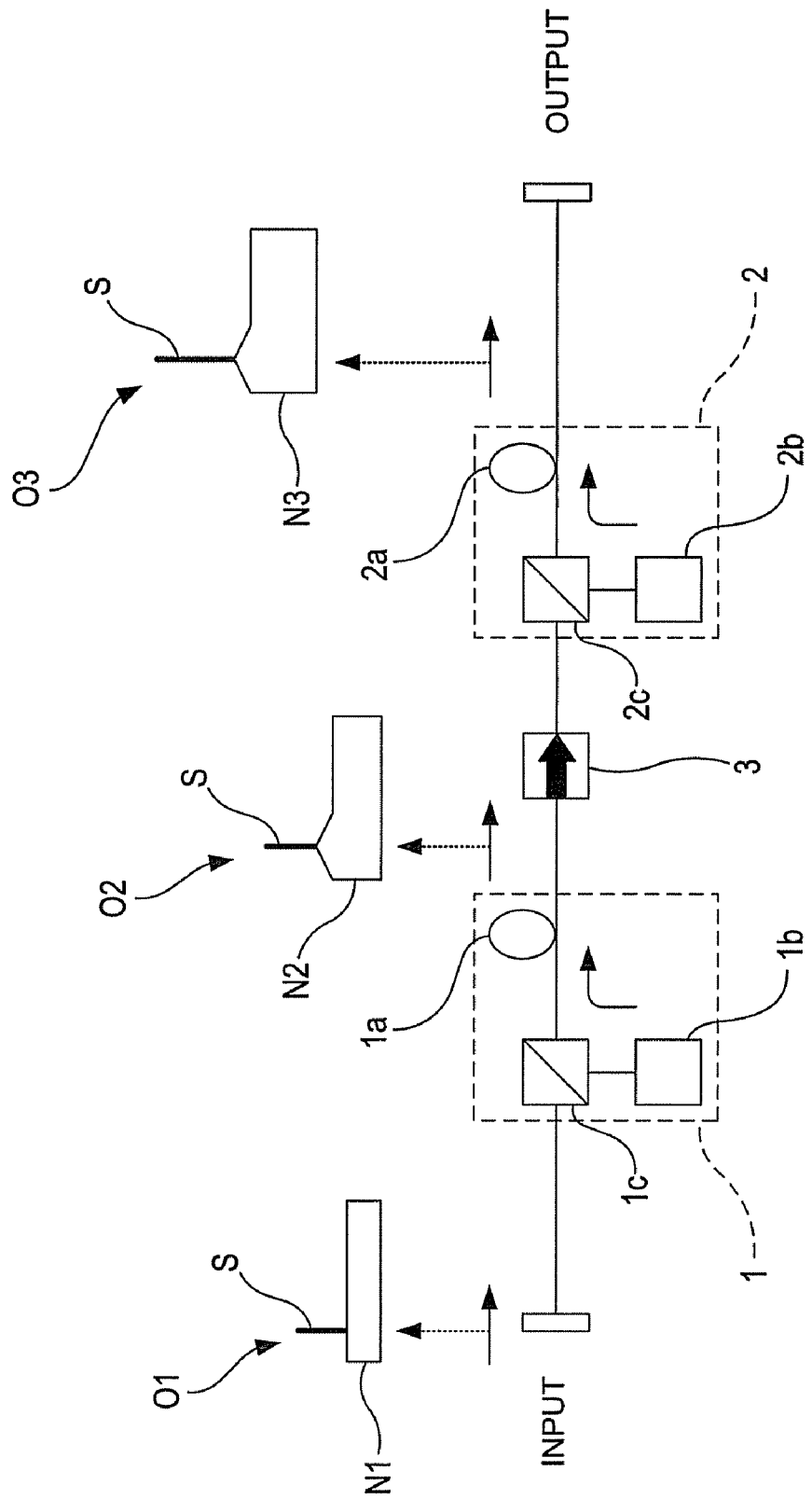
FIG. 7 illustrates a known optical amplifier.

FIG. 6 illustrates an optical amplifier according to a third embodiment. The optical amplifier according to the third embodiment differs from the optical amplifier according to the first embodiment illustrated in FIG. 2A in that a first EDFA 100 and a second EDFA 110 are of the bidirectional pumping type. The optical isolator 40, the light supplying unit 51, the ASE-light transmission path 52, and the light input unit 61 are the same as those in the first embodiment. Moreover, the optical amplifier can include the band pass filter 53 illustrated in FIG. 2B as illustrated by dotted lines in FIG. 6.

The first EDFA 100 of the bidirectional pumping type includes a first EDF 101, a first forward-pumping light source 102 that generates excitation light for forward pumping of the first EDF 101, and a first forward-pumping optical multiplexer 103 that is disposed upstream of the first EDF 101 and supplies the excitation light generated by the first forward-pumping light source 102 to the first EDF 101. The first EDFA 100 further includes a first backward-pumping light source 104 that generates excitation light for backward pumping of the first EDF 101 and a first backward-pumping optical multiplexer 105 that is disposed downstream of the first EDF 101 and supplies the excitation light generated by the first backward-pumping light source 104 to the first EDF 101. When WDM signal light is amplified, the amplifier can include a gain equalizer downstream of the backward-pumping optical multiplexer 105. The first forward-pumping light source 102 and the backward-pumping light source 104 include laser diodes that generate excitation light with a wavelength of, for example, 0.98 μm or 1.48 μm, and the first forward-pumping optical multiplexer 103 and the backward-pumping optical multiplexer 105 include, for example, WDM couplers. The first excitation light source 102 and the second excitation light source 104 can be a single light source, and can split and supply excitation light to the EDF 101 for bidirectional pumping.

Similarly, the second EDFA 110 of the bidirectional pumping type includes a second EDF 111, a second forward-pumping light source 112 that generates excitation light for forward pumping of the second EDF 111, and a second forward-pumping optical multiplexer 113 that is disposed upstream of the second EDF 111 and supplies the excitation light generated by the second forward-pumping light source 112 to the second EDF 111. The second EDFA 110 further includes a second backward-pumping light source 114 that generates excitation light for backward pumping of the second EDF 111 and a second backward-pumping optical multiplexer 115 that is disposed downstream of the second EDF 111 and supplies the excitation light generated by the second backward-pumping light source 114 to the second EDF 111. The first excitation light source 112 and the second excitation light source 114 can be a single light source, and can split and supply excitation light to the EDF 111 for bidirectional pumping.

Herein, the amplifier can include, for example, a gain equalizer for WDM downstream of the backward-pumping optical multiplexer 115. As in the first EDFA 100, the second forward-pumping light source 112 and the backward-pumping light source 114 include laser diodes that generate excitation light with a wavelength of, for example, 0.98 μm or 1.48 μm, and the second forward-pumping optical multiplexer 113 and the backward-pumping optical multiplexer 115 include, for example, WDM couplers.

In the optical amplifier according to the third embodiment, the ASE light traveling backward and extracted by the light supplying unit 51 has a spectral shape similar to that of the ASE light illustrated in FIG. 2A. Therefore, the degree of polarization of components of the input light amplified in the second EDF 111, the components having wavelengths adjacent to that of the signal light S in a short wavelength region in the C band, is reduced by the ASE light extracted by the light supplying unit 51 and input from the light input unit 61 to the second EDFA 111. As in the first embodiment, the OSNR of the light output from the optical amplifier according to the third embodiment after amplification is improved since the polarization dependent gain caused by the polarization hole burning in the second EDF 111 is suppressed due to a reduction in the degree of polarization of the input light.

The optical amplifier according to the third embodiment can include the light supplying unit disposed upstream of the second EDF 111 and the light input unit disposed downstream of the first EDF 101 as in the second embodiment illustrated in FIG. 5.

In the above-described embodiments, the EDFs are excited by forward pumping or bidirectional pumping in which excitation light is input to the EDFs from upstream thereof. Aside from these, the EDFAs of the backward pumping type to which excitation light is input from downstream of the EDFs can also reduce the degree of polarization of the input light inside the EDFs by extracting the ASE light arising in one of the EDFAs and inputting the light to the other EDFA.

Moreover, although the EDFs are used for amplifying the signal light including the signal components in a short wavelength region in the C band in the above-described embodiments, the first and second amplifiers are not limited to the EDFAs. Other optical amplifiers using other rare-earth-doped optical fibers can also reduce the degree of polarization by using the ASE light traveling backward, and can be effective when the ASE light traveling backward includes components with wavelengths in the vicinity of that of the signal light.

A simulation result obtained by specifying numerical values in the optical amplifier illustrated in FIG. 2A will now be described. It was hypothesized that input light O10 of −20.4 dBm was input to the optical amplifier, that the wavelength of the signal light S included in the input light O10 was 1,531.9 nm, and that the OSNR of the input light O10 was 34.00 dB (0.1 nm resolutions). Moreover, it was hypothesized that the gain of the entire optical amplifier was 22.9 dB, and that the signal light output from the optical amplifier was amplified to 2.5 dBm. Furthermore, it was hypothesized that the length of the first EDF 21 was 11 m, that the length of the second EDF 31 was 14 m, that the wavelength of the excitation light generated by the excitation light sources 22 and 32 were 0.98 μm, and that the intensity of the excitation light was set such that the gain of the first EDF 21 became 25.8 dB and the gain of the second EDF 31 became 9 dB.

According to the simulation result, ASE light A10 having a spectral shape illustrated in FIG. 3 and a power of 0.2 dBm arose in the first EDF 21. The ASE light A10 traveling in a direction opposite to that of the input light O10 was input from downstream of the second EDF 31 to the second EDF 31 through the light supplying unit 51 and the light input unit 61. Input light O11 of −1.4 dBm and ASE light of −9.8 dBm traveling forward through the optical isolator 40 were input to the second EDF 31 from upstream thereof. The degree of polarization of the input light O11 was reduced from 87% to 39% in the second EDF 31 due to the ASE light A12 input from the light input unit 61, and the polarization dependent gain caused by the polarization hole burning was suppressed from 0.17 dB to 0.09 dB. With this, the polarization dependent gain of the entire optical amplifier was suppressed from 0.34 dB to 0.26 dB.

Due to the suppression of the polarization dependent gain, the OSNR of the output light O12 output from the optical amplifier was improved from 30.84 dB to 30.87 dB. Although the improvement in the OSNR for each optical amplifier was small, the effect of the improvement accumulates and grows significantly after multiple relay transmission. For example, the OSNR of the signal light after transmission of 15 spans was improved from 20.40 dB to 20.95 dB by providing the optical amplifier illustrated in FIG. 2A for each relay station.

In accordance with the optical amplifier and the method for suppressing the polarization dependent gain according to the above-described technology, ASE light traveling in a direction opposite to that of signal light among ASE light arising in a rare-earth-doped optical fiber in one of the cascaded optical amplifiers is input to a rare-earth-doped optical fiber in the other optical amplifier. In the rare-earth-doped optical fiber to which the ASE light traveling backward is input, the degree of polarization of the light with wavelengths in the vicinity of that of the input ASE light is reduced, and the polarization dependent gain caused by the polarization hole burning is suppressed.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. An optical amplifier, comprising:
a first optical amplifier including
a first rare-earth-doped optical medium having an end to which input light is input from an input port,
a first light source that generates excitation light, and
a first optical multiplexer that is disposed upstream of the first rare-earth-doped optical medium and supplies the excitation light generated by the first light source to the end of the first rare-earth-doped optical medium;
an optical isolator receiving the input light;
a second optical amplifier including
a second rare-earth-doped optical medium having an end to which the input light is input after the input light has been passed through the optical isolator,
a second light source that generates excitation light, and
a second optical multiplexer that is disposed upstream of the second rare-earth-doped optical medium and supplies the excitation light generated by the second light source to the end of the second rare-earth-doped optical medium, the first optical amplifier and the second optical amplifier being serially connected to each other on an optical path between the input port and an output port with the optical isolator interposed therebetween;
a light supplying unit that is disposed on an optical path connecting the input port and the end of the first rare-earth-doped optical medium and supplies amplified spontaneous emission light arising in the first rare-earth-doped optical medium and traveling in a direction opposite to the traveling direction of the input light; and
a light input unit that is disposed on an optical path connecting the other, downstream end of the second rare-earth-doped optical medium and the output port and inputs the amplified spontaneous emission light supplied by the light supplying unit via the optical path to the other end of the second rare-earth-doped optical medium.

2. The optical amplifier according to claim 1, wherein the input light includes signal light with a wavelength in the vicinity of a wavelength at which power of the amplified spontaneous emission light is maximum.

3. The optical amplifier according to claim 2, wherein the first and second rare-earth-doped optical mediums are erbium-doped optical mediums, and
the input light includes signal light in a short wavelength region in the C band.

4. The optical amplifier according to claim 1, further comprising:
a band pass filter that limits the band of the amplified spontaneous emission light disposed on a path, through which the amplified spontaneous emission light is transmitted, between the light supplying unit and the light input unit.

5. The optical amplifier according to claim 1, wherein the light supplying unit and the light input unit each include an optical circulator.

6. A method for suppressing polarization dependent gain occurring in an optical amplifier including a first amplifier that amplifies input light by forward-pumping or bidirectionally pumping a first rare-earth-doped optical medium, a second amplifier that amplifies input light by forward-pumping or bidirectionally pumping a second rare-earth-doped optical medium, and an optical isolator disposed between the first amplifier and the second amplifier that are serially connected to each other, comprising:
extracting amplified spontaneous emission light arising in the first rare-earth-doped optical medium and traveling in a direction opposite to a traveling direction of the input light, and inputting the amplified spontaneous emission light to the second rare-earth-doped optical medium from downstream of the second rare-earth-doped optical medium.

7. The method for suppressing the polarization dependent gain according to claim 6, wherein
the input light includes signal light with a wavelength in the vicinity of a wavelength at which power of the amplified spontaneous emission light is maximum.

8. The method for suppressing the polarization dependent gain according to claim 7, wherein
the first and second rare-earth-doped optical mediums are erbium-doped optical mediums, and
the input light includes signal light in a short wavelength region in the C band.

9. An optical transmission system comprising an optical amplifier according to claim 1 located in a relay station for amplifying and relaying optical signals.

10. An optical amplifier, comprising:
a first optical amplifier including
a first rare-earth-doped optical medium having an end to which input light is input from an input port,
a first light source that generates excitation light, and
a first optical multiplexer that is disposed upstream of the first rare-earth-doped optical medium and supplies the excitation light generated by the first light source to the end of the first rare-earth-doped optical medium;
an optical isolator receiving the input light;
a second optical amplifier including
a second rare-earth-doped optical medium having an end to which the input light is input after the input light has been passed through the optical isolator, a second light source that generates excitation light, and a second optical multiplexer that is disposed upstream of the second rare-earth-doped optical medium and supplies the excitation light generated by the second light source to the end of the second rare-earth-doped optical medium, the first optical amplifier and the second optical amplifier being serially connected to each other on an optical path between the input port and an output port with the optical isolator interposed therebetween, signal light being amplified by the light generated by at least one of the light sources using the rare-earth-doped optical mediums;

a light supplying unit that is disposed on an optical path connecting the input port and the end of the first rare-earth-doped optical medium and supplies amplified spontaneous emission light arising in the first rare-earth-doped optical medium and traveling in a direction opposite to the traveling direction of the input light; and a light input unit that is disposed on an optical path connecting the other downstream end of the second rare-earth-doped optical medium and the output port and inputs the amplified spontaneous emission light supplied by the light supplying unit via the optical path to the other end of the second rare-earth-doped optical medium.

11. An optical amplifier, comprising:

a first optical amplifier using a rare-earth-doped optical medium for amplifying input light;

a second optical amplifier using a rare-earth-doped optical medium for amplifying output light of the first optical amplifier;

an isolator disposed between the first optical amplifier and the second optical amplifier so as to be optically coupled;

a first supplying unit disposed upstream of the first optical amplifier that supplies amplified spontaneous emission light, output from the first optical amplifier in a direction opposite to a traveling direction of the input light, in a direction different from the traveling direction of the input light; and a second supplying unit that supplies the amplified spontaneous emission light supplied by the first supplying unit to the second optical amplifier.

12. The optical amplifier according to claim 11, wherein the first supplying unit includes an optical coupler or an optical circulator.

13. The optical amplifier according to claim 11, wherein the second supplying unit includes an optical coupler, a WDM filter, or an optical circulator.

14. The optical amplifier according to claim 11, further comprising a band pass filter that is disposed between the first supplying unit and the second supplying unit and allows passage of the amplified spontaneous emission light.

15. An apparatus, comprising:

a first optical amplifier that uses a rare-earth-doped optical medium;

an isolator that inputs amplified light amplified by the first optical amplifier;

a second optical amplifier that uses a rare-earth-doped optical medium to amplify a light output from the isolator; and a first light router that routes amplified spontaneous emission light generated by the first optical amplifier or the second optical amplifier to input, by a second light router, the routed amplified spontaneous emission light to the optical rare-earth-doped medium other than the optical rare-earth-doped medium in which the routed amplified spontaneous emission light is generated.

16. The apparatus according to claim 15, wherein the first light router and the second light router include one of an optical circulator and an optical coupler.

* * * * *